US005153523A

United States Patent [19]

Samaniego

[11] Patent Number: 5,153,523

[45] Date of Patent: Oct. 6, 1992

[54] SELECTIVE FUSED CIRCUIT CONTINUITY TEST APPARATUS

[76] Inventor: Joseph Samaniego, P.O. Box 10641, Marina Del Rey, Calif. 90295

[21] Appl. No.: 617,194

[22] Filed: Nov. 23, 1990

[51] Int. Cl.[5] ....................... G01R 31/02; H01H 85/30

[52] U.S. Cl. .................................... 324/550; 324/133; 340/638; 337/209

[58] Field of Search ....................... 324/507, 550, 133; 340/638, 639; 337/206, 209, 241, 265

[56] References Cited

U.S. PATENT DOCUMENTS

| | | | |
|---|---|---|---|
| 1,967,296 | 7/1934 | Dixon et al. | 324/550 X |
| 2,783,331 | 2/1957 | Sundt | 337/206 |
| 3,744,003 | 7/1973 | Dipace | 337/209 X |
| 4,281,322 | 7/1981 | Nasu et al. | 340/638 |
| 4,815,993 | 3/1989 | Falchetti | 340/638 X |

*Primary Examiner*—Jack B. Harvey
*Attorney, Agent, or Firm*—William H. Maxwell

[57] ABSTRACT

A fuse and circuit testing apparatus providing a fuse adapter for each of a multiplicity of fuses and accessory circuits, the adapter inserted into a receptacle and carrying the fuse, the circuit at one terminal of each fuse being isolated for selector switch continuity through either the accessory or a continuity testing circuit.

17 Claims, 2 Drawing Sheets

SELECTIVE FUSED CIRCUIT CONTINUITY TEST - APPARATUS

BACKGROUND OF THE INVENTION

This invention relates to the testing of individual circuits that supply voltages to electrically powered equipment, especially in automotive vehicles and the like wherein separate fused circuits power the various accessories. For example, there are separate fused circuits servicing the head lamp, the general lighting, the horn, the window wipers, the radio, the heater and air conditioning, and window operators, etc. In the event of a malfunction such as an inoperative actuator motor or the like, the question arises whether the fuse in a particular circuit is functioning or expended because of overloading or short circuiting. When the fuse is good and functional, then one must look to other causes of malfunctioning, which may be in a motor or accessory wiring and/or switching. Accordingly, it is a general object of this invention to provide a testing circuit for selectively determining circuit continuity through protective fuses and accessories.

Electrical equipment such as automotive vehicles are provided with fuse panels or fuse blocks, in which there are separate fuses for protecting individual circuits.

The equipment or vehicle is most often a factory produced piece of equipment, carfully wired with identified circuitry, wherein electrical voltage is applied to one side of a fuse panel, or fuse block, and wherein separately fused circuits emanate from the other side. It is an object of this invention to adapt testing circuitry to the equipment or vehicle in its manufactured condition, without change. Accordingly, a fuse adapter is provided that interrupts the individual fuse circuits, whereby each fuse is disconnected from its accessory circuit for testing. It is also an object to reconnect each selected fuse circuit to a battery terminal for normal "ON" operation protected by an accessibly replaceable fuse. It is still another object to provide an "OFF" condition of the test circuit when applied to a selected fused circuit and its accessory.

State of the art practice places fuse panels, or fuse blocks, in hard to get at and difficult locations, it being an object of this invention to extend the adapted fuse panel wiring to an accessible location, as for example to the face of the equipment panel, or to the face of the vehicle instrument panel.

The state of this art is ever changing, with the use of various types of fuses. The conventional and widely used cartridge type fuse is shown herein, however it is to be understood that this does not preclude the use of other types of fuses, such as prong or blade contact fuses and those of plug-in configuration, nor are circuit breakers to be excluded. The present invention provides an adapter that connects into the fused circuit to be tested. Accordingly, it is an object of this invention to provide selective switching means by which a multiplicity of separate fused circuits are maintained in individual electrical continuity, with the exception of one selected circuit to be tested. To this end a progressively operable selector switch is provided with one pair of contacts reserved for the testing circuit that determines continuity through the fuse and/or through the related accessory.

Fuse adapters are provided to be inserted into each electrical circuit to be tested. Each adapter is connected to an indentifiable input terminal on a selector switch which has corresponding output terminals to each identifiable accessory circuit. The electrical continuity circuit means as it is later disclosed herein, has a mode selector switch by which fuse continuity is tested, and by which accessory continuity is tested directly through a fused circuit from the main power supply, the battery.

SUMMARY OF THE INVENTION

This invention is characterized by a fuse adapter inserted between the fuse receptacle and the fuse per se. The function of this adapter is to establish electrical continuity from the power supply, battery voltage, to the input terminal of the fuse, and most importantly to interrupt electrical continuity at the output terminal of the fuse. A feature here is the provision of a testing circuit selectively connected to said output terminal of the fuse, and alternately connecting the accessory circuit into electrical continuity with said output terminal. Accordingly, a mode switch is provided for testing or for normal "ON" operation of the accessory circut that is being tested. Another feature of this invention is the selectivity of any one of a multiplicity of circuits to be tested, a selector switch means characterized by a pair of contacts that completes a testing circuit at any one of the aforesaid output terminals of the fuse or fuse adapter. As a result, an inexpensive plug-in system with accessible controls for testing a multiplicity of accessory circuits is provided, to determine the condition of the fuse and circuit selected, and for the reconnection of fused electrical power as may be required.

The foregoing and various other objects and features of this invention will be apparent and fully understood from the following detailed description of the typical preferred forms and applications thereof, throughout which description reference is made to the accompanying drawings in which:

THE DRAWINGS

FIG. 1 is of the fuse testing circuit as it is related to a single fuse determined by a selector switch.

FIG. 2 is an enlarged exploded view of an adapter which characterizes the invention, and its relationship to the receptacle of a fuse block. And, FIGS. 3 and 4 are views taken substantially as indicated by lines 3—3 and 4—4 on FIG. 2.

PREFERRED EMBODIMENT

Figure 1:
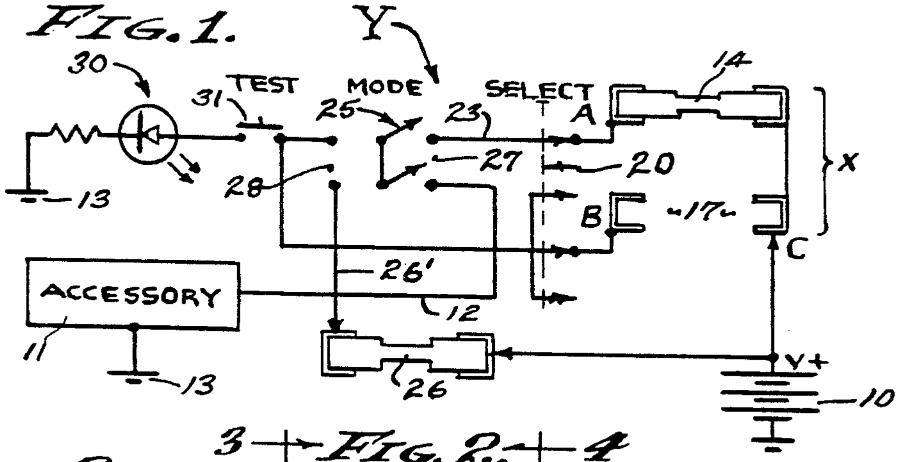
Figure 3:
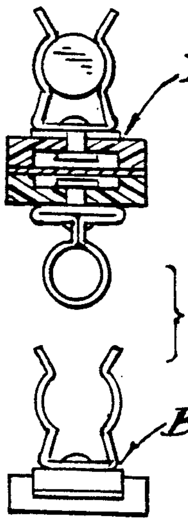

The equipment or vehicle circuitry is shown generally in FIG. 1 of the drawings as including a battery 10 power supply, an accessory 11, and a positive circuit 12 through the accessory to a negative ground 13. A fuse 14 protects the circuit 12 and accessory 11. In accordance with this invention, a circuit interrupting adapter means X is inserted into the fuse block receptacle 15 to receive the battery voltage at terminal C and to separate said voltage at terminals A and B after passing through the fuse 14. The receptacle 15 is wired into the equipment or vehicle with the power voltage applied at terminal C and the circuit 12 emanating at terminal A, this circuitry being hard wired and permanent. In accordance with this invention, the adapter means X separates the output terminal A from the output terminal B of receptacle 15. That is, there are two separate output terminals A and B, one from the fuse 14 and the other from the receptacle 15 to the accessory circuit 12.

Figure 2:
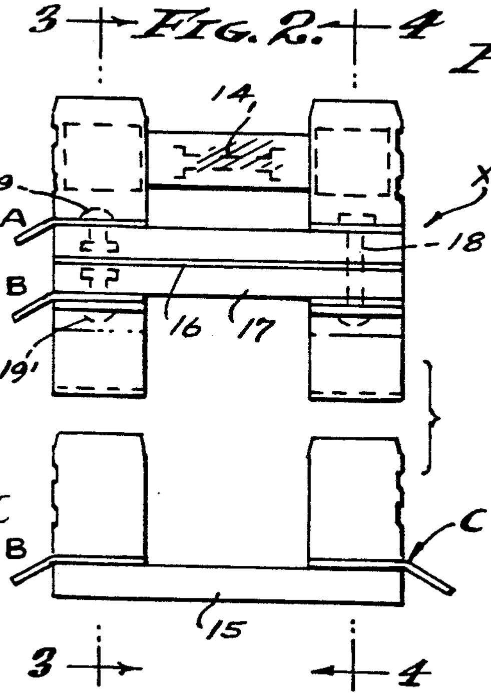
Figure 4:
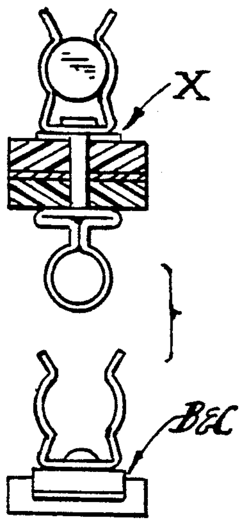

The adapter means X is comprised of a base 17 that simulates the C and B contact features of a fuse 14, and of such configuration that it is insertable into the receptacle 15 of the fuse block. A feature of the adapter means X is that it receives the fuse 14 that is inserted therein to contact the input power source terminal C, but with its output terminal A electrically isolated from the output terminal B of the receptacle 15. As shown in FIG. 2 the terminals A and B are fastened to bodies of dielectric material separated by a layer of insulation 16. The power source terminals C are fastened by a single conductive member, a rivet 18, while the terminals A and B are each fastened a separate conductive member, rivets 19 and 19'. The receptacle 15 is of conventional state of the art design as circumstances require.

A selective test circuit means Y is provided as shown in FIG. 1, comprised of a circuit selector switch means 20, a mode selector switch means 25, and indicator means 30. The circuit selector switch means 20 selects the accessor circuit 12 from terminal B to terminal A to which the test circuit means Y is connected, thereby isolating a selected one of a multiplicity of circuits for testing its fuse 14 and accessory 11. The mode selector switch means 25 determines which one of two circuits is to be tested for continuity, the primary fuse circuit, and secondarily the accessory circuit per se by providing power supplied through a replaceable fuse 26 directly through line 26' from battery 10. The indicator means 30 senses the condition of the fuse 14, or of the fuse 26, as may be selected.

Figure 5:
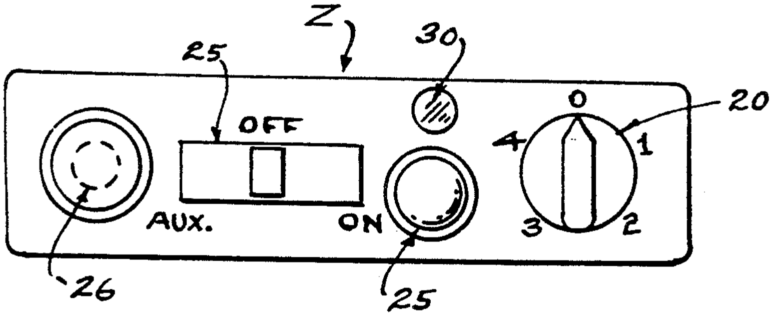
FIG. 5 is a detailed view of a typical control panel.
Figure 6:
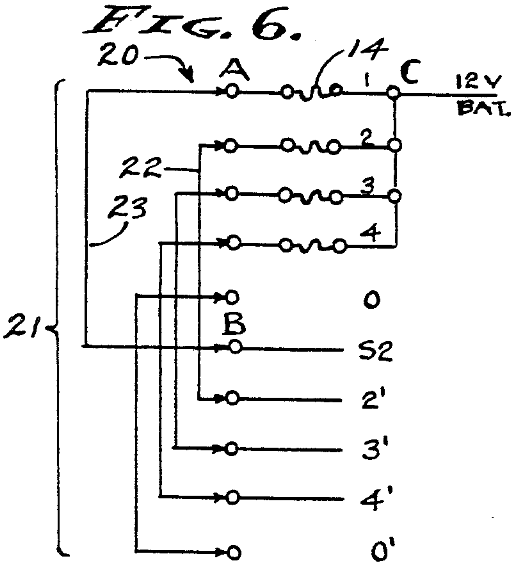
FIGS. 6, 7, 8 and 9 are diagrams of the selector switch means in each one of four circuit selecting conditions, in each with continuity through the testing circuit, while the circuits not being tested remain operative.
Figure 7:
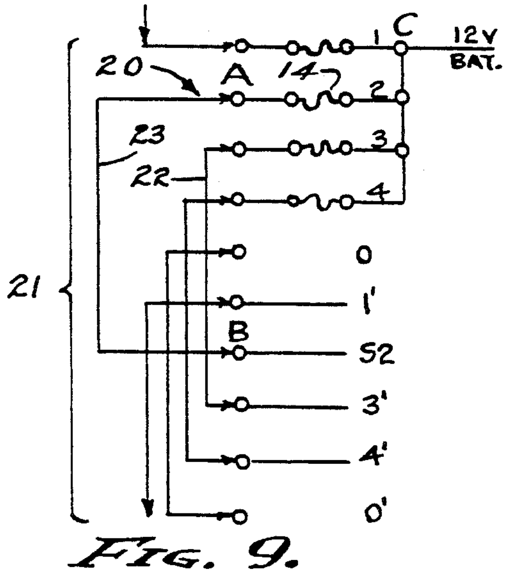
Figure 8:
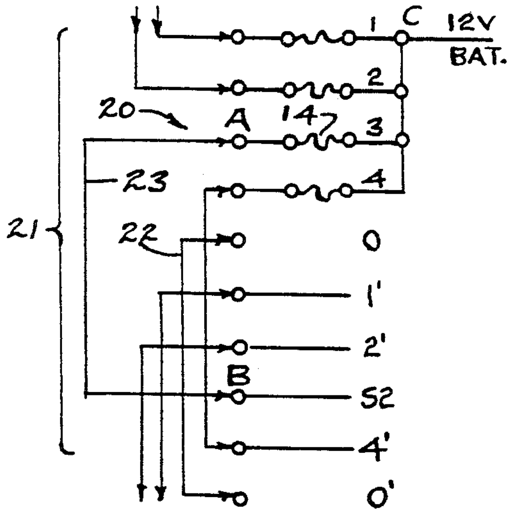
Figure 9:
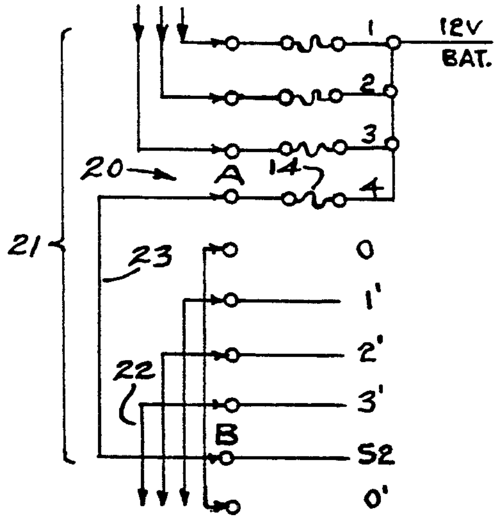

The circuit selector means 20 is indicated generally in FIG. 1, and more particularly in FIGS. 6 through 9. For purpose of example, the control module Z shown in FIG. 5 has a circuit selector switch 20 displaying four circuit test positions 1 through 4. These four circuits are represented in FIGS. 6–9 as inputs 1–4 available through fuses 14, and outputs 1'–4' to each accessory 11. The selector switch means 20 is a gang switch 21 wherein jumpers 22 sequentially connect input 1 with output 1', and input 2 with output 2', and input 3 with output 3', and input 4 with output 4', etc. as and when added circuits are involved. However, in addition to these jumper 22 contacts as shown, there is a test jumper 23 that is selectively positioned by manual positioning of the switch to interconnect the A and B terminals of any one of said four circuits, and there are dead position contacts 0 and 0', exclusive of any one of the aforesaid jumpers 22. Therefore, while all other jumper circuits are operatively connected between their terminal A and B, a dead position can be selected between 0 and 0', or a selected circuit can be connected through the test circuit means Y (see FIGS. 6–9).

The circuit selecting jumper 23 extends from the fuse terminal A as determined by the selector switch means 20 contacts, and to the mode selector switch means 25 contacts 27. Contacts 27 when closed complete a series circuit from the fuse 14 to ground 13 through the accessory 11 circuit 12, while contacts 28 when closed complete a series circuit through fuse 26 to ground 13 and through the indicator means 30. The means 25 has a third "OFF" mode position (as shown) whereby all grounding circuits are open with respect to the aforesaid circuitry. The replaceable fuse 26 is accessible at the front face of the control module Z for testing a selected accessory circuit. As shown, there are three mode positions (see FIG. 5), "ON" for fuse testing, "OFF" for no connection whatsoever, and "AUX" for replaceable fuse testing directly from the battery 10. The series circuit through contacts 28 extends to a terminal B connector on the base 17 of adapter means X, which in turn is in contact through the receptacle contacts to the hard wired terminal B.

The indicator means 30 is a visible means, preferably a light emitting diode LED in series through fuse 26 to ground through a button type test switch 31 from contacts 28. Said LED is also in series to ground 13 from the battery 10 from terminal B for direct operation of the accessory circuit 12 through contacts 27 from terminal A connected by jumper 22 to terminal B of the receptacle base 17. Accordingly, there are three mode positions, "OFF", "ON" and "AUX".

From the foregoing it will be understood how any one of a multiplicity of accessory circuits can be quickly selected by manual positioning of the switch 21. One of two mode functions is selected, an "ON" position for testing a fuse 14, and an "AUX" position for testing the circuit 12 and accessory 11 directly from the battery 10 and through a readily accessible replaceable fuse. These functions are selected by mode switch 25, which has an "OFF" position that disconnects all active circuits of this testing system.

Having described only the typical preferred forms and applications of my invention, I do not wish to be limited or restricted to the specific details herein set forth, but wish to reserve to myself any modifications or variations that may appear to those skilled in the art as set forth within the limits of the following claims.

I claim:

1. A fused circuit testing apparatus for an electrical power source in a system having at least one fuse receptacle adapted to receive a protective fuse at an electrical input terminal and with an electrical output terminal to an accessory circuit, and including;

a fuse adapter means having electrically isolated input and output terminals received in the input and output terminals of the fuse receptacle, the input terminal of the adapter being in electrical continuity with the input terminal of the receptacle, and the output terminal of the adapter being electrically isolated from the output terminal of the receptacle, said input and output terminals of the adapter receiving the fuse therebetween, a selective test circuit means switching electrical continuity from the output terminal of the adapter means to the output terminal of the receptacle and alternately to a circuit continuity indicator means.

2. The fused circuit testing apparatus as set forth in claim 1, wherein the continuity indicator means is a switch and light emitting diode in series to ground.

3. The fused circuit testing apparatus as set forth in claim 1, wherein the selective test circuit means includes a control module extended by conductors from the electrically isolated output terminals of the receptacle and the adapter means.

4. The fused circuit testing apparatus as set forth in claim 1, wherein the selective test circuit means includes a mode selector switch means for disconnecting the output terminals of the receptacle and fuse adapter means and directly connecting a conductor from the continuity indicator means to the electrical power source.

5. The fused circuit testing apparatus as set forth in claim 4, wherein one of the conductors from the continuity indicator means to the electrical power source is in series through a protective fuse.

6. The fused circuit testing apparatus as set forth in claim 1, wherein the selective test circuit means includes a control module extended by conductors from the electrically isolated output terminals of the receptacle and the adapter means, and wherein the selective test circuit means includes a mode selector switch means for disconnecting the output terminals of the receptacle and fuse adapter means and directly connecting a conductor from the continuity indicator means to the electrical power source.

7. The fused circuit testing apparatus as set forth in claim 6, wherein one of the conductors from the continuity indicator means to the electrical power source is in series through a protective fuse.

8. The fused circuit testing apparatus as set forth in claim 6, wherein one of the conductors from the continuity indicator means to the electrical power source is in series through a protective fuse replaceable in the control module.

9. A multi-fused circuit testing apparatus for an electrical power source in a system having a multiplicity of fuse receptacles and each adapted to receive a protective fuse at an electrical input terminal and each with an output terminal to an accessory circuit, and including:

a multiplicity of fuse adapter means and each having electrically isolated input and output terminals received in the input and output terminals of one of the multiplicity of fuse receptacles, the input terminal of each adapter being in electrical continuity with the input terminal of each receptacle, and the output terminal of each adapter being electrically isolated from the output terminal of each receptacle, said input and output terminals of each adapter receiving the fuse therebetween, a selective test circuit means switching electrical continuity from the output terminal of each adapter means to the output terminal of the receptacle in which it is inserted and alternately to a circuit continuity indicator means.

10. The multi-fused circuit testing apparatus as set forth in claim 9, wherein the selective test circuit means is comprised of a sequentially positioned gang switch having a multiplicity of jumpers with shiftable contacts for continuity between output terminals of the adapter means and receptacle at each of said multiplicity of fuses, and an additional jumper with contacts for continuity through the circuit continuity indicator means.

11. The multi-fused circuit testing apparatus as set forth in claim 9, wherein the continuity indicator means is a switch and light emitting diode is series to ground.

12. The multi-fused circuit testing apparatus as set forth in claim 10, wherein the selective test circuit means includes a control module extended from the multiplicity of receptacle adapter means fuses by conductors from the electrically isolated output terminals of each receptacle an adapter means.

13. The multi-fused circuit testing apparatus as set forth in claim 10, wherein the selective test circuit means includes a mode selector switch means for disconnecting the output terminals of a selected receptacle and fuse adapter means and directly connecting a conductor from the continuity indicator means to the electrical power source.

14. The multi-fused circuit testing apparatus as set forth in claim 13, wherein one of the conductors from the continuity indicator means to the electrical power source is in series through a protective fuse.

15. The multi-fused circuit testing apparatus as set forth in claim 10, wherein the selective test circuit means includes a control module extended by conductors from the electrically isolated output terminals of the receptacles and adapter means, and wherein the selective test circuit means includes a mode selector switch means for disconnecting the output terminals of the receptacle and fuse adapter means and directly connecting a conductor from the continuity indicator means to the electrical power source.

16. The multi-fused circuit testing apparatus as set forth in claim 15, wherein one of the conductors from the continuity indicator means to the electrical power source is in series through a protective fuse.

17. The multi-fused circuit testing apparatus as set forth in claim 15, wherein one of the conductors from the continuity indicator means to the electrical power source is in series through a protective fuse replaceable in the control module remote from the receptacle.

* * * * *